(12) United States Patent
Kuong et al.

(10) Patent No.: US 9,182,424 B2
(45) Date of Patent: Nov. 10, 2015

(54) MULTIPLE RIGID CONTACT SOLUTION FOR IC TESTING

(71) Applicant: JF Microtechnology Sdn. Bhd., Petaling Jaya, Selangor (MY)

(72) Inventors: Foong Wei Kuong, Petaling Jaya (MY); Goh Kok Sing, Petaling Jaya (MY); Shamal Mundiyath, Petaling Jaya (MY); Muhamad Izzat Bin Roslee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 359 days.

(21) Appl. No.: 13/847,411

(22) Filed: Mar. 19, 2013

(65) Prior Publication Data

US 2013/0249583 A1 Sep. 26, 2013

(30) Foreign Application Priority Data

Mar. 20, 2012 (MY) .......................... PI 2012001263

(51) Int. Cl.
*G01R 1/067* (2006.01)
*G01R 1/04* (2006.01)

(52) U.S. Cl.
CPC .............. *G01R 1/067* (2013.01); *G01R 1/0466* (2013.01); *G01R 1/0483* (2013.01)

(58) Field of Classification Search
CPC ...... G01R 31/28; G01R 1/067; G01R 1/0466; G01R 1/0483; H01R 13/24
USPC ........... 324/756.02, 755.01, 755.04; 439/264, 439/296, 330, 525–526, 70
See application file for complete search history.

(56) References Cited

U.S. PATENT DOCUMENTS

| | | | |
|---|---|---|---|
| 6,244,874 B1 * | 6/2001 | Tan | 439/66 |
| 7,619,425 B2 * | 11/2009 | Kimura | 324/756.05 |
| 2007/0032128 A1 * | 2/2007 | Lopez et al. | 439/525 |

* cited by examiner

*Primary Examiner* — Son Le
(74) *Attorney, Agent, or Firm* — Maschoff Brennan

(57) ABSTRACT

A chip testing solution having two separate contacts: one to provide current and one to measure voltage. One contact acts as the force and other as sense, and with its unique short wipe stroke technology enables the electrical connection from the contact terminal of the device under test (DUT) to the loadboard without fail even after prolonged insertion/testing of the devices. The two contacts are in close proximity, but electrically isolated from each other. Each contact is made to electrically touch a single conductive lead/pad on the DUT thus forming a test connection. The two contacts; one on front and other on back, wiping on the lead/pads will generally be a "sense" probe, and a "force" used for making a Kelvin connection. The short contact is connected to the loadboard by means of an additional contact known as "interposer" extending through and top of the tall contact base body.

6 Claims, 9 Drawing Sheets

MULTIPLE RIGID CONTACT SOLUTION FOR IC TESTING

FIELD OF INVENTION

The present invention relates generally to an apparatus for establishing an electrical connection between an integrated chip and a circuit board for testing said chip, and more particularly to integrated chips with rigid contact pins forming a contacting solution that allows kelvin testing as well as for testing multi-row chips.

BACKGROUND OF INVENTION

An electrical connection to the loadboard is basically accomplished during a single insertion/compression of the device under test on to the contact pins by applying a certain amount of force. The conductive pads/leads of the device under tests generally form a layer of oxides that need to be broken through to make a successful connection and testing of the DUT. In addition to the natural oxide barriers, there are residual organic materials that remain on the surface of the conductive leads/pads. These migration of the oxides to the contact tip of the test pin acts as a thin insulating layer that makes it very difficult to achieve and maintain very low contact resistances on testing thus, negatively affects test results and ultimately reducing device yields.

Most of the time the device under test (DUT) undergoes testing with spring actuated probes or vertical probing, where the mentioned residues will remain imposed on to the contact tip of the pin resulting it to very high contact resistance leading to poor test yields. There is too the trend of testing the DUT that are plated with NiPd/NiPdAu on the contact leads/pads which are often considered as the hard contact surface and the probes that test this surface contact often experience premature wearing of the contact tip.

For devices aimed at Kelvin testing, there are known in the art cantilever type, where one of the contacts is formed as a cantilever, and sandwich types, where both contacts are sandwiched over an electrical insulator. With both these types, there is minimal wiping action on the pad/lead of the chip. With the sandwich type, the width of the contacts is very thin, thus making it structurally weak and prone to breakage. Also with the sandwich type, assembly for fine pitching is difficult.

It is highly challenging to test a multi row quad flat no lead device using normal test solutions such as cantilever pins or rigid pins contact methods. The conventional multi row QFN pads generally forms a pattern of chessboard, where the first row and second row are placed at certain distance to each other. The testing of such multi raw QFN is made possible through the "double decking" of the short pin over a tall pin by means of an interposer contact to load board.

What is needed is an improved chip testing solution that overcomes the above problems for a Kelvin testing solution as well as for multi-row chip testing.

SUMMARY OF INVENTION

In overcoming the above disadvantages, this invention provides a chip testing solution having two separate contacts: one to provide current and one to measure voltage. As a Kelvin testing solution, one contact, known here as a tall contact, acts to supply electrical current to the DUT and other, known here as a short contact, is used to sense a voltage coming from the DUT. Each contact is supported by a pair of resilient members that allow them to rock about one end. The other end is where they connect with the pad/lead of the DUT, so this rocking action produces a unique short wipe stroke that wipes of any oxide layer between the contacts and pad/lead. This enables the electrical connection from the pad/lead of the device under test (DUT) to the loadboard without fail even after prolonged insertion/testing of the devices.

For accurate testing of certain critical device under test which may get affected by the layers of residues or oxides on the surface of the device leads/pads, the present invention includes two contacts which are in close proximity, adjacent to but electrically isolated from each other and to contact a single conductive lead/pad forming a test connection. The short contact is said to have the connection to the loadboard by means of an additional contact named as "interposer" extending through the top of the tall contact base body.

This invention thus relates to an apparatus for establishing an electrical connection between a chip and a circuit board for testing said chip including: a tall contact, each said tall contact hinged at a first end such that it is rotatable about said first end when a force is applied at a second end, said tall contact including a first resilient member located at an intermediate point between said first and said second ends, such that said first resilient member is adapted to bias a rotation of said tall contact when a force is applied at said second end; at least a short contact, each said short contact hinged at a first end such that it is rotatable about said first end when a force is applied at a second end, said short contact including a second resilient member located at an intermediate point between said first and said second ends, such that said second resilient member is adapted to bias a rotation of said short contact when a force is applied at said second end; an interposer member connecting said short contact to a load board terminal whereby the tall and short contact elements are electrically isolated from each other, and said second end of tall contact and said second end of short contact are adapted to establish contact with a surface of said chip at the same time. Insulating housings for electrically insulating each of the tall contact and short contact are provided. A pocket for keeping said force insulating housing and short insulating housing aligned is also provided. The interposer member is adapted to make electrical connection with said load board terminal with a sufficient pretension force to allow surface variations of the load board terminal. Resilient membranes are provided at the first ends of tall contact and short contact such that said tall and short contacts are pretensioned when pressed at said second ends of tall and short contacts.

It is the trend to test the multi row QFNs normally by the spring probes or pogo pins, that always generate the scenario mentioned above. Having the rigid pins in contact, making contact to the both first row and second row pads gives a rigid probing enabling a successful test with higher yields. This possibility enhances with the help of the pins having the placement, one over another by means of the intermediate contact pin that connects to the loadboard.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

DETAILED DESCRIPTION OF INVENTION

It should be noted that the following detailed description is directed to an apparatus for establishing an electrical connection between a chip and a circuit board for testing said chip and is not limited to any particular size or configuration but in fact a multitude of sizes and configurations within the general scope of the following description.

Figure 1:
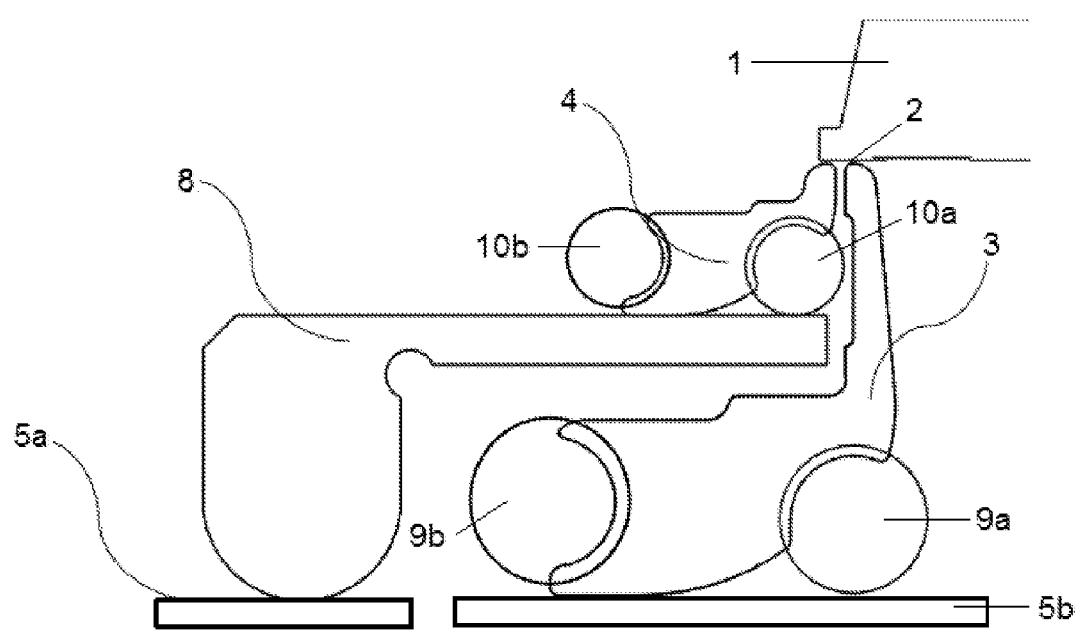
FIG. 1 shows a cross sectional view of a test socket done in accordance with the first embodiment of the invention used as in a configuration for kelvin and multi row QFN device testing, particularly illustrating a device under test in an uncompressed state.
Figure 2:
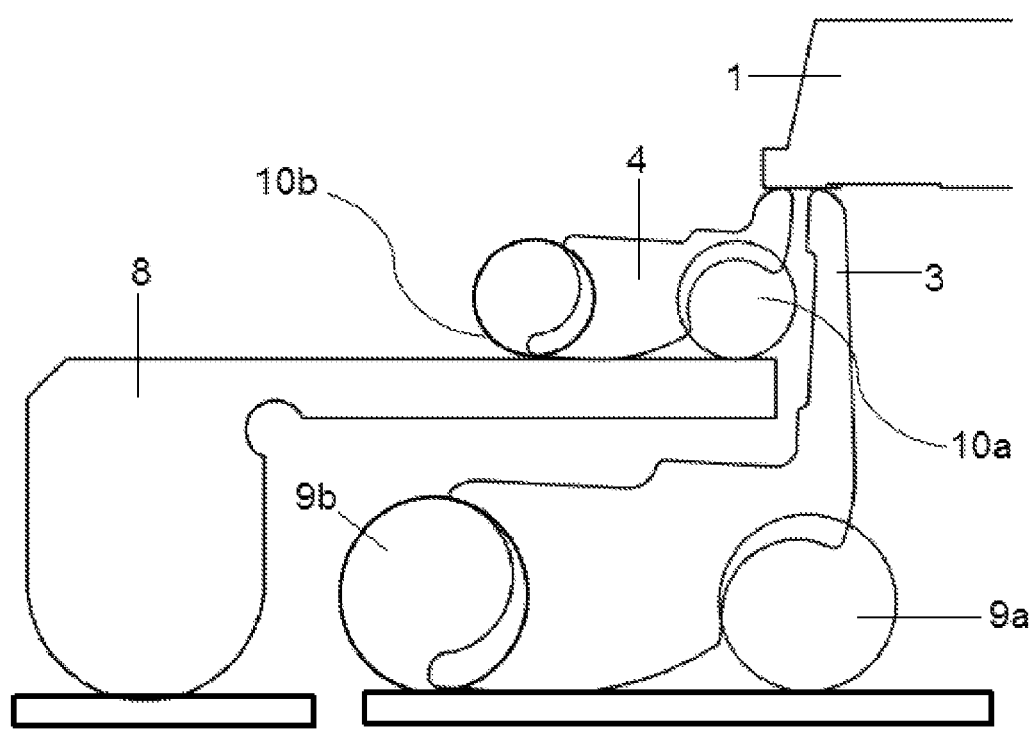
FIG. 2 shows a cross sectional view of a test socket done in accordance with the first embodiment of the invention used as in a configuration for kelvin and multi row QFN device testing, particularly illustrating a device under test in a compressed state.

Referring to FIGS. 1 and 2, there is shown a test socket with the device under test (DUT) (1) in an uncompressed state, comprising of three conducting elements that makes a connection between the device under test (1) and the load board. The moving elements comprising a tall contact (3) and a short contact (4) are each supported by resilient members (9a,9b) and (10a,10b), respectively. The resilient members allow the tall (3) and short (4) contacts to rock about an axis located near one end, such that the other end, which is contactable with a pad/lead (2) of the DUT (1), provides a short wiping action on said pad/lead. The tall contact (3) rests on a first load board terminal (5a). An interposer member (8) is located between the said short contact (4) and a second load board terminal (5b), said interposer (8) being electrically conductive and thus establishing contact between the short contact (4) and load board terminal (5b).

FIG. 2 shows the motion dynamics of the elements after compression of the DUT (1), that is when it is brought towards the apparatus. The short contact (4) and the tall contact (3) move simultaneously along the direction of the pad (2), wiping away an oxide layer of the pad (2) of the device under test (1), and making a good electrical contact between a terminal of the DUT (1) and said load board terminals (5a,5b).

Figure 3:
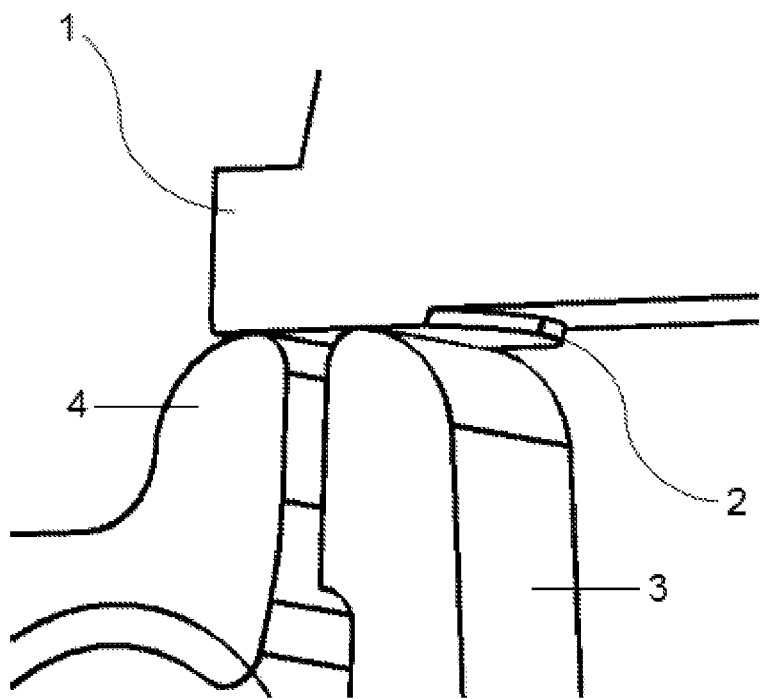
FIG. 3 shows a view of contact pins making the contact with the pad of the device under test in an embodiment of this invention.

FIG. 3 shows a close up view of the tall contact (3) and short contact (4) in contact with a pad (2) of a device under test (1).

Figure 4:
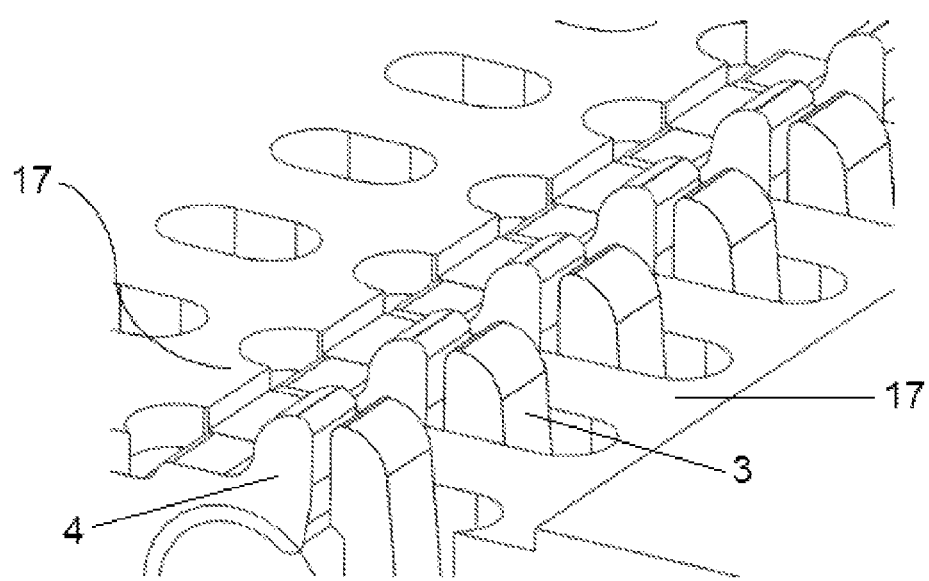
FIG. 4 show a perspective view of an assembly of the contact pins where the pins protrude out through the slots of the top insulator housing (sense, short pin)

FIG. 4 shows a short contact housing (17) that acts as an electrical insulator for said short contact (4).

Figure 5:
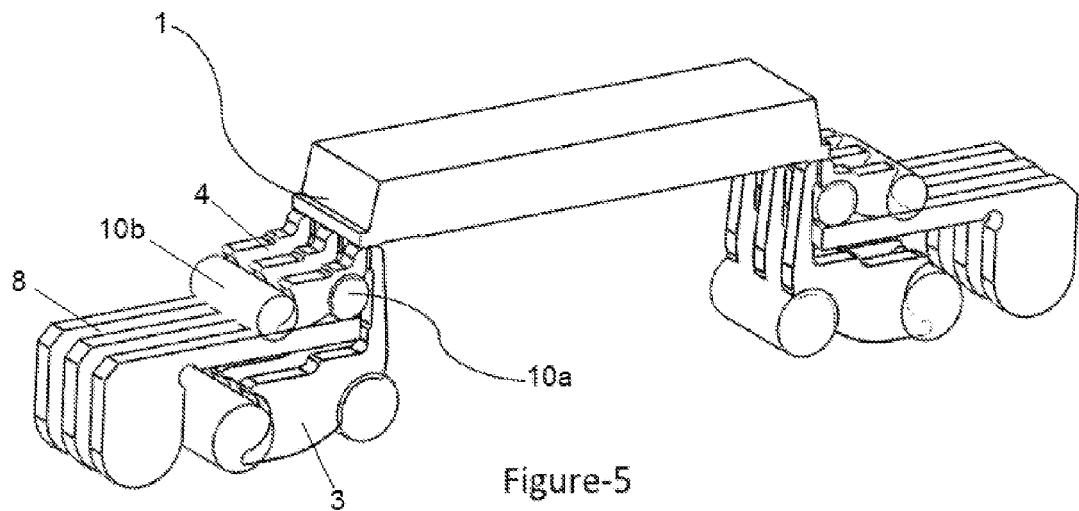
FIG. 5 shows an isometric cross sectional view of the invention with the device under test in an embodiment of this invention.

FIG. 5 shows an example of a device under test (1) that is leaded, that is with protrusions where the contacts are. The present invention is designed to work with both padded and leaded devices under test.

Figure 6:
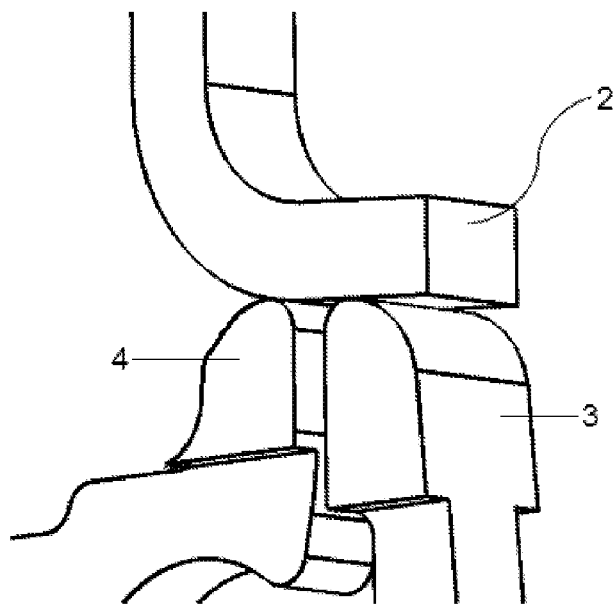
FIG. 6 shows a view of force and short contactors in a front and back configuration for kelvin testing for leaded device under test in an embodiment of this invention.

FIG. 6 shows a close up view of the legs (2) of a leaded device under test and the short (4) and tall (3) contacts.

Figure 7:
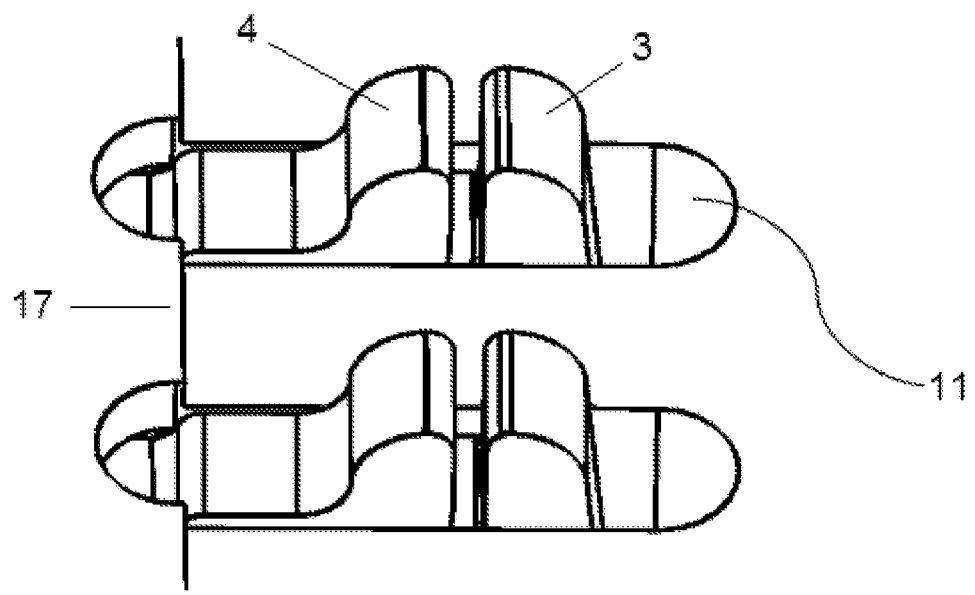
FIG. 7 shows a view of force and short contactors in a front and back configuration for kelvin testing projecting out through a single slot in an embodiment of this invention.

FIG. 7 shows a first embodiment of this invention where the aim is to achieve Kelvin testing. In this embodiment, the tall contact (3) is used to deliver electrical current into the DUT (1), and the short contact (4) is used to "sense" or detect voltage from the DUT. A short contact housing slot (11) located on the short contact housing (17) allows both the tall (3) and short (4) contacts to pass through it.

Figure 8:
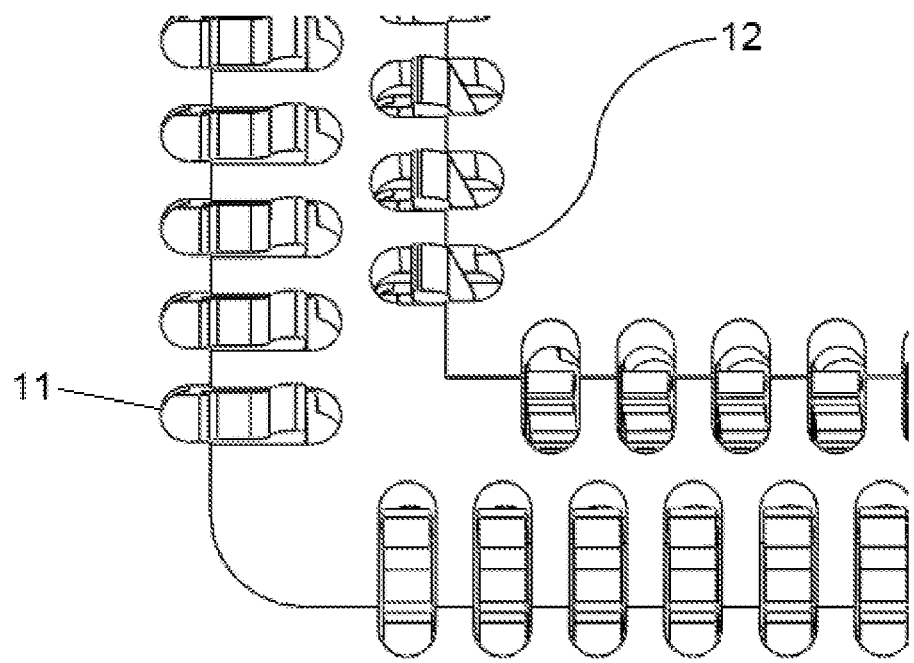
FIG. 8 shows a view of tall and short contactors for multi row QFN testing, projecting out through separate slots of the short pin contactor insulating housing in an embodiment of this invention.

FIG. 8 shows a second embodiment of this invention where the aim is to allow multi-row chips to be tested. By spacing the tall (3) and short (4) contacts further apart, either by using a different or same housing, this invention can be used as a tester for multi-row chips. With a dual row chip array, an additional slot (12) is provided for the tall contact (3). The short contact (4) goes through slot (11).

Figure 9:
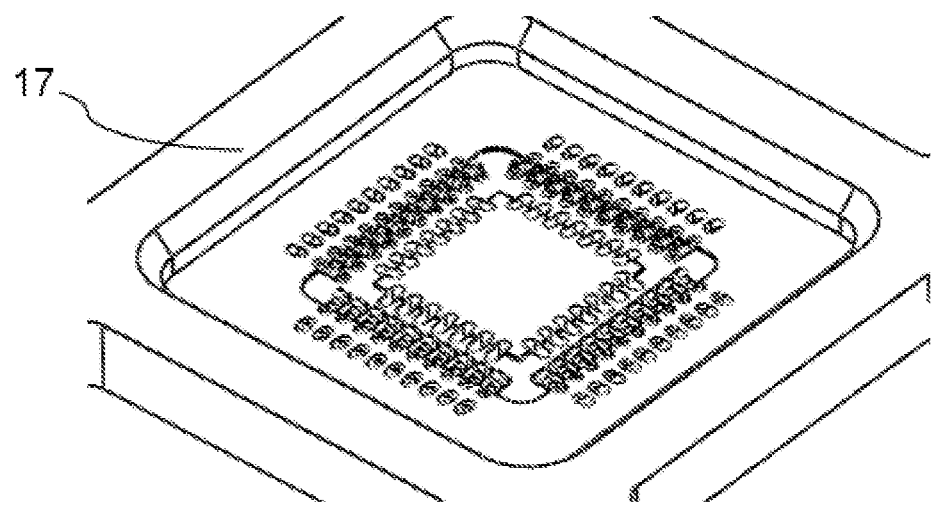
FIG. 9 shows a view of a short contactors assembly of the insulator housing in an embodiment of this invention.

FIG. 9 shows the short contact housing (17) around a typical array of the tall (3) and short (4) contacts.

Figure 10:
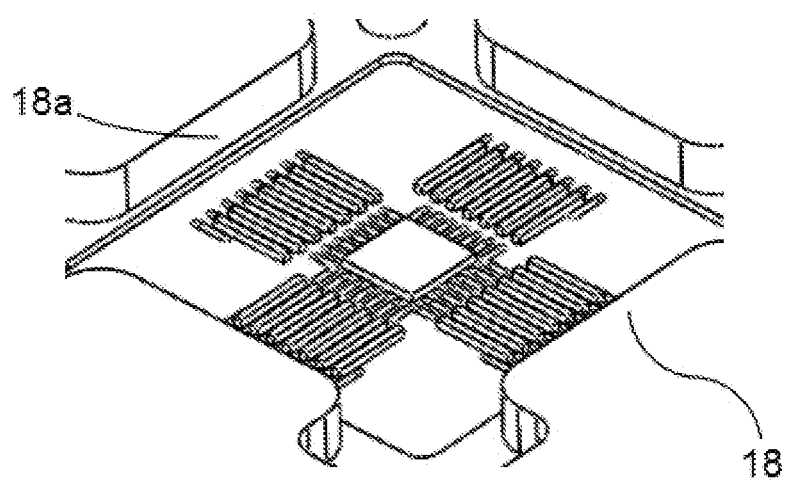
FIG. 10 shows a view of tall contactors (force pin) insulating housing assembly with the tall pin (Force pin) and the pocket where the short contactors (short contact pin) housing guides through the wall and align inside the pocket in an embodiment of this invention.

FIG. 10 shows a tall contact housing (18) with a guide wall (18a) to guide the short contact housing (shown in FIGS. 8 and 10) in.

Figure 11:
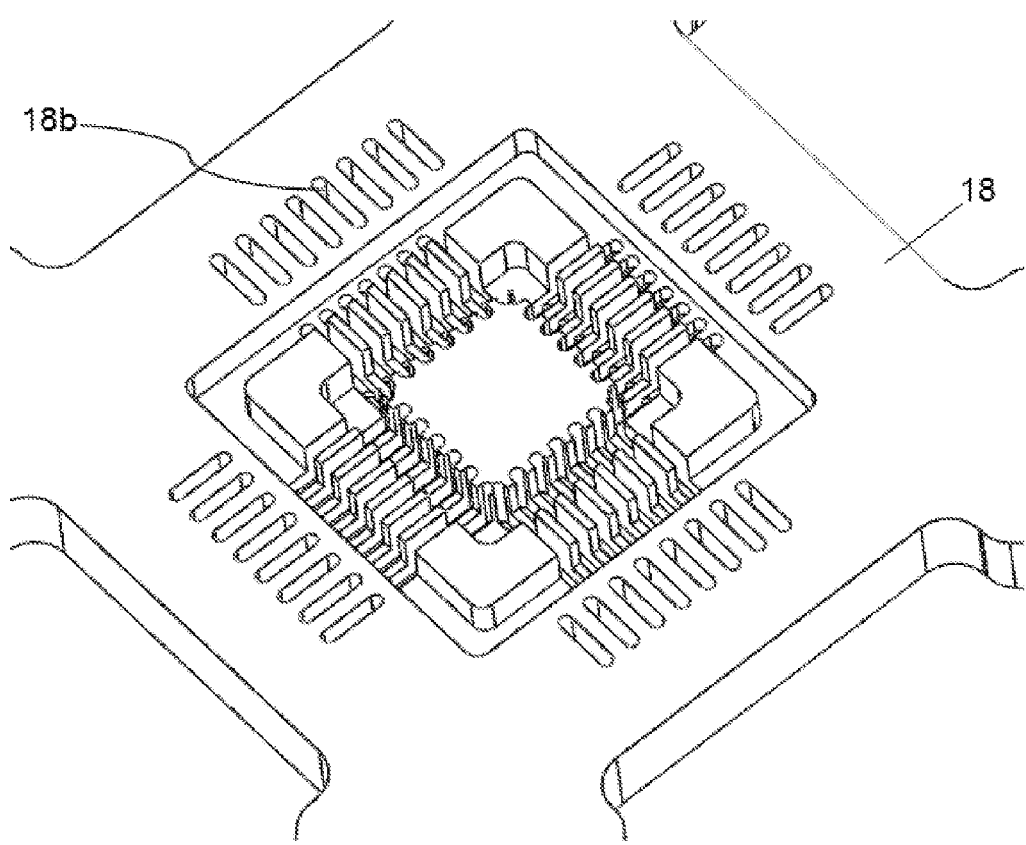
FIG. 11 shows a view of slots provided for the interposer pin to project out to make contact to a loadboard in an embodiment of this invention.

FIG. 11 shows the tall contact housing (18) with a slot (18b) for the interposer (shown in FIG. 1).

Figure 12:
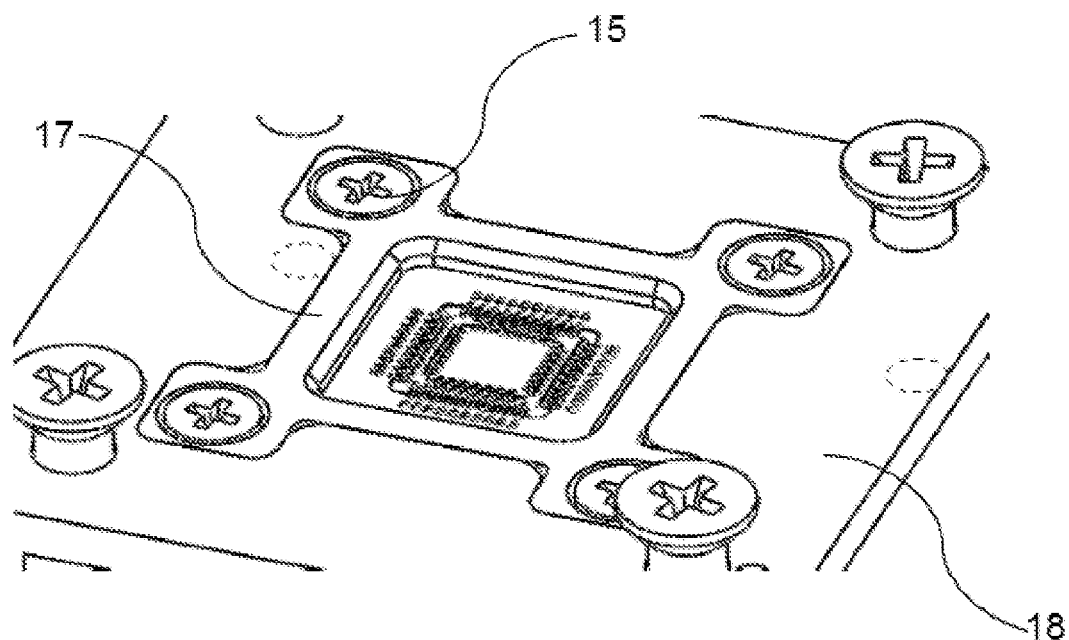
FIG. 12 shows a view of tall and short contactors insulator housing mounting method by screw and shows that both housings lie in the same plane.

FIG. 12 shows the short contact housing (17) located in said tall contact housing (18). The short contact housing (17) may be secured by screws (15) or other means.

Figure 13:
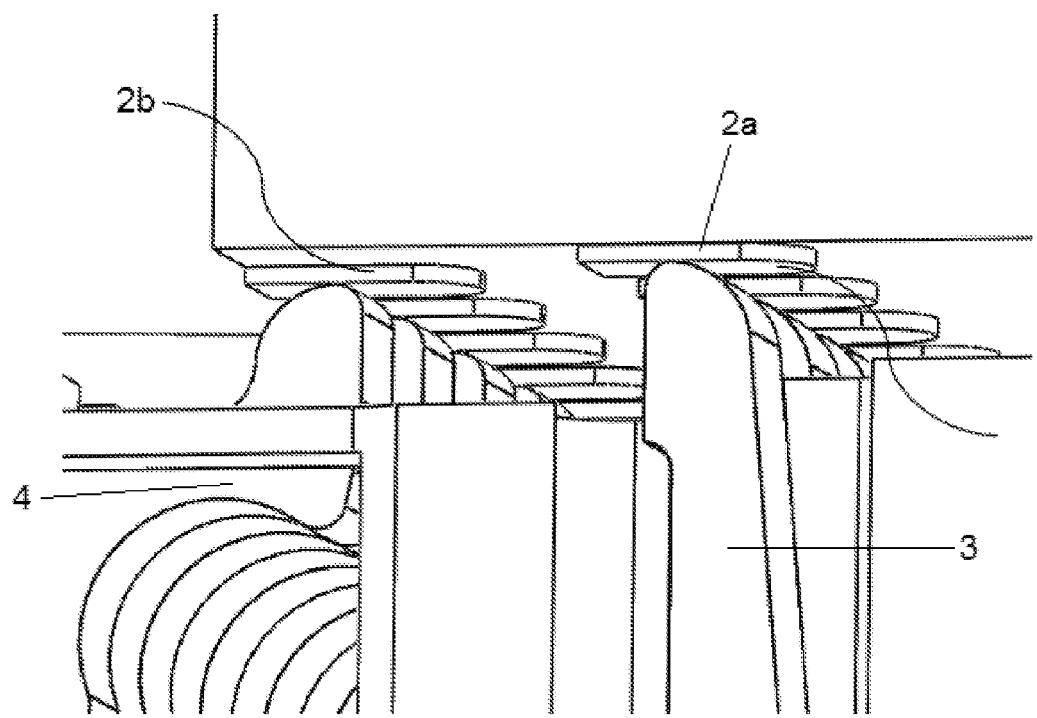
FIG. 13 shows a view of tall and short contactors configuration for multi row QFN testing, making contact with the pads of the multi row QFN in an embodiment of this invention.

FIG. 13 shows a close up of a configuration to test multi-row chips. The DUT (1) has two rows of contact pads (2a,2b) in the case of a dual row chip. The tall (3) and short (4) contacts are brought further apart from each other in line with the respective rows of pads (2a,2b).

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the spirit and scope of this invention.

The invention claimed is:

1. An apparatus for establishing an electrical connection between a chip and a circuit board for testing said chip comprising:

at least a tall contact, each said tall contact hinged at a first end such that it is rotatable about said first end when a force is applied at a second end, said tall contact including a first resilient member located at an intermediate point between said first and said second ends, such that said first resilient member biases a rotation of said tall contact when a force is applied at said second end;

at least a short contact, each said short contact hinged at a first end such that it is rotatable about said first end when a force is applied at a second end, said short contact including a second resilient member located at an intermediate point between said first and said second ends, such that said second resilient member biases a rotation of said short contact when a force is applied at said second end;

an interposer member electrically connecting said short contact to a load board terminal whereby said tall and short contact elements are electrically isolated from each other, and said second end of said tall contact and said second end of said short contact establish contact with a surface of said chip at the same time.

2. The apparatus for establishing an electrical connection between a chip and a circuit board for testing said chip according to claim 1 wherein the said tall contact is used to deliver electrical current to said chip, and said short contact is used to detect voltage from said chip.

3. The apparatus for establishing an electrical connection between a chip and a circuit board for testing said chip according to claim 1 further including a short insulating housing for electrically insulating said short contact.

4. The apparatus for establishing an electrical connection between a chip and a circuit board for testing said chip according to claim 1 further including a pocket, said pocket keeping said force insulating housing and said short insulating housing aligned.

5. The apparatus for establishing an electrical connection between a chip and a circuit board for testing said chip according to claim 1 wherein said interposer member makes electrical connection with said load board terminal with a sufficient pretension force to allow surface variations of the load board terminal.

6. The apparatus for establishing an electrical connection between a chip and a circuit board for testing said chip according to claim 1 further including resilient membranes at said first ends of said tall contact and said short contact such that said tall and short contacts are pretensioned when pressed at said 20 second ends of said tall and short contacts.

* * * * *